(12) United States Patent
Chang et al.

(10) Patent No.: US 9,285,677 B2
(45) Date of Patent: Mar. 15, 2016

(54) LITHOGRAPHY PROCESS ON HIGH TOPOLOGY FEATURES

(71) Applicant: Taiwan Semiconductor Manufacturing Company, Ltd., Hsin-Chu (TW)

(72) Inventors: Chun-Wei Chang, Tainan (TW); Hong-Da Lin, Taipei (TW); Chih-Chien Wang, Changhua (TW); Chun-Chang Chen, Tainan (TW); Wang-Pen Mo, Pingtung (TW); Hung-Chang Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 14/071,890

(22) Filed: Nov. 5, 2013

(65) Prior Publication Data
US 2014/0272715 A1  Sep. 18, 2014

Related U.S. Application Data

(60) Provisional application No. 61/778,261, filed on Mar. 12, 2013.

(51) Int. Cl.
*G03F 7/26* (2006.01)
*G03F 7/00* (2006.01)
*G03F 7/09* (2006.01)

(52) U.S. Cl.
CPC .............. *G03F 7/0035* (2013.01); *G03F 7/091* (2013.01)

(58) Field of Classification Search
USPC ................................................ 430/273.1, 315
See application file for complete search history.

(56) References Cited

U.S. PATENT DOCUMENTS

2013/0181320 A1 *  7/2013  Chen ................... H01L 21/0276
257/499
2014/0080067 A1     3/2014  Chen et al.

* cited by examiner

*Primary Examiner* — Daborah Chacko Davis
(74) *Attorney, Agent, or Firm* — Slater & Matsil, L.L.P.

(57) ABSTRACT

A method includes forming a first photo resist layer over a base structure and a target feature over the base structure, performing an un-patterned exposure on the first photo resist layer, and developing the first photo resist layer. After the step of developing, a corner portion of the first photo resist layer remains at a corner between a top surface of the base structure and an edge of the target feature. A second photo resist layer is formed over the target feature, the base structure, and the corner portion of the first photo resist layer. The second photo resist layer is exposed using a patterned lithography mask. The second photo resist layer is patterned to form a patterned photo resist.

20 Claims, 6 Drawing Sheets

LITHOGRAPHY PROCESS ON HIGH TOPOLOGY FEATURES

This application claims the benefit of provisionally filed U.S. Patent Application No. 61/778,261, filed Mar. 12, 2013, and entitled "Lithography Process on High Topology Features," which application is hereby incorporated herein by reference.

BACKGROUND

In the formation of integrated circuits, the components of the integrated circuit devices need to be patterned to form desirable shapes. A typical patterning process includes a lithography process, which includes coating a photo resist over a target layer that is to be patterned, exposing the photo resist using a lithography mask, developing the photo resist, and using the developed photo resist to etch the target layer. As a result, the layout of the developed photo resist is transferred to the underlying layer. The photo resist is then removed.

There are some integrated circuits whose formation involves high topology features. In the high topology features, the height difference between a high feature and a neighboring low feature may be as high as about 100 nm to about 300 nm, or even higher. For example, Fin Field-Effect Transistors (FinFETs) typically have fins much higher than the top surface of surrounding Shallow Trench Isolation (STI) regions. In addition, gate dielectrics, polysilicon gates, and hard masks may be stacked over the fins. Therefore, the heights of these layers are further added to the heights of the fins. This results in a severe topography problem that incurs difficulty in the respective lithography process.

When lithography processes are performed on the wafers having a high topology, the photo resist and the Bottom Anti-Reflective Coating (BARC) need to be formed. The photo resist and the BARC suffer from thickness non-uniformity. For example, the BARC may be accumulated at the corner formed between an edge of a tall feature and a top surface of a low feature. On the other hand, the portion of the BARC directly over the tall feature may have a very small thickness. As a result, the BARC thickness is not uniform throughout a respective wafer.

To reduce the thickness uniformity, various approaches were taken. For example, a negative tone photo resist may be used to fill the gaps next to tall features. A positive tone photo resist is then used to define the desirable patterns. This process, however, incurs increased process cost since an additional negative tone photo resist needs to be formed, and an additional lithography process and lithography mask are needed to pattern the negative tone photo resist. In addition, in these processes, damages may occur to the portions of the tall features that are not supposed to be etched, while residues of the low features may be undesirable left after the patterning.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A patterning process incorporating a lithography process is provided in accordance with various exemplary embodiments. The intermediate stages of performing the patterning process are illustrated. The variations of the embodiments are discussed. Throughout the various views and illustrative embodiments, like reference numbers are used to designate like elements.

Figure 1:
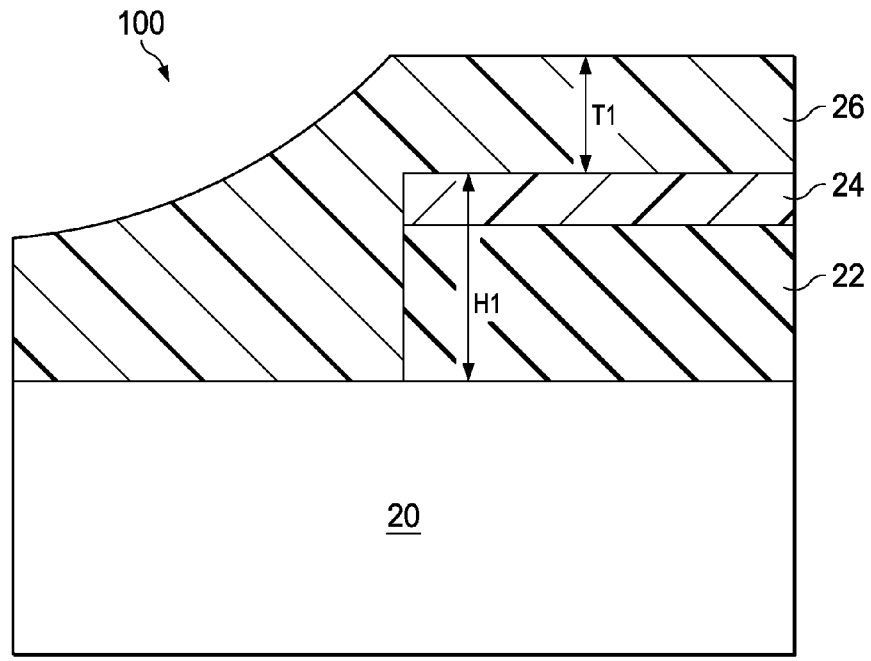
FIGS. 1 through 8 are cross-sectional views of intermediate stages of a lithography process in accordance with some exemplary embodiments.

Referring to FIG. 1, an initial structure of wafer 100 is formed. The initial structure includes base structure 20, and target feature 22 over base structure 20. In accordance with some embodiments, base structure 20 includes the features selective from, and not limited to, a semiconductor substrate, a dielectric substrate, dielectric layers, metal features (not shown), or the like. Target feature 22 is the feature that is to be patterned (etched) in subsequent lithography processes. Target feature 22 may be any of a semiconductor feature, a dielectric feature, a metallic feature, and the like. In some exemplary embodiments, Target feature 22 comprises polysilicon, and may be used to form polysilicon gates for transistors such as Fin Field-Effect Transistors (FinFETs).

Hard mask 24 may be formed over target feature 22 in some embodiments to help pattern target feature 22. In some embodiments, hard mask 24 comprises silicon nitride, titanium nitride, tantalum nitride, or the like. In alternative embodiments, there is no hard mask formed over target feature 22. The combined height H1 of features 24 and 22 may be greater than about 100 nm, and may also be between about 100 nm and about 300 nm. It is appreciated, however, that the values recited throughout the description are merely examples, and may be changed to different values.

Photo resist 26 is applied over hard mask 24 and base structure 20. The thickness T1 of photo resist 26 is related to height H1, and the greater height H1 is, the greater thickness T1 is used. In some exemplary embodiments, thickness T1 is greater than about 50 percent, or greater than about 75 percent, height H1. Photo resist 26 may be applied, for example, by spin coating. In some embodiments, photo resist 26 is a positive tone photo resist. The positive tone photo resist 26 comprises a polymer, and is free from, or substantially free from, any cross-linking agent therein. When exposed to light, the exposed portions of positive tone photo resist 26 are decomposed, and may be removed in a subsequent developing step. The unexposed portions of positive tone photo resist 26 are not decomposed, and will not be removed by the development step.

In alternative embodiments, photo resist 26 is a negative tone photo resist. The negative tone photo resist 26 also comprises a polymer, and comprises a cross-linking agent. In some exemplary embodiments, the cross-linking agent that may be comprised in negative tone photo resist 26 is selected from the group consisting of amino compounds such as melamine resins, urea resins, guanamine resins, glycoluril-formaldehyde resins, succinamide-formaldehyde resins, ethylene urea-formaldehyde resins, and combinations thereof. When exposed to light, the exposed portions of the polymer chain in negative tone photo resist 26 cross-link with each other, and will not be removed in a subsequent developing step. The unexposed portions of the negative tone photo resist do not cross-link, and hence are removed by the development step.

Figure 2:
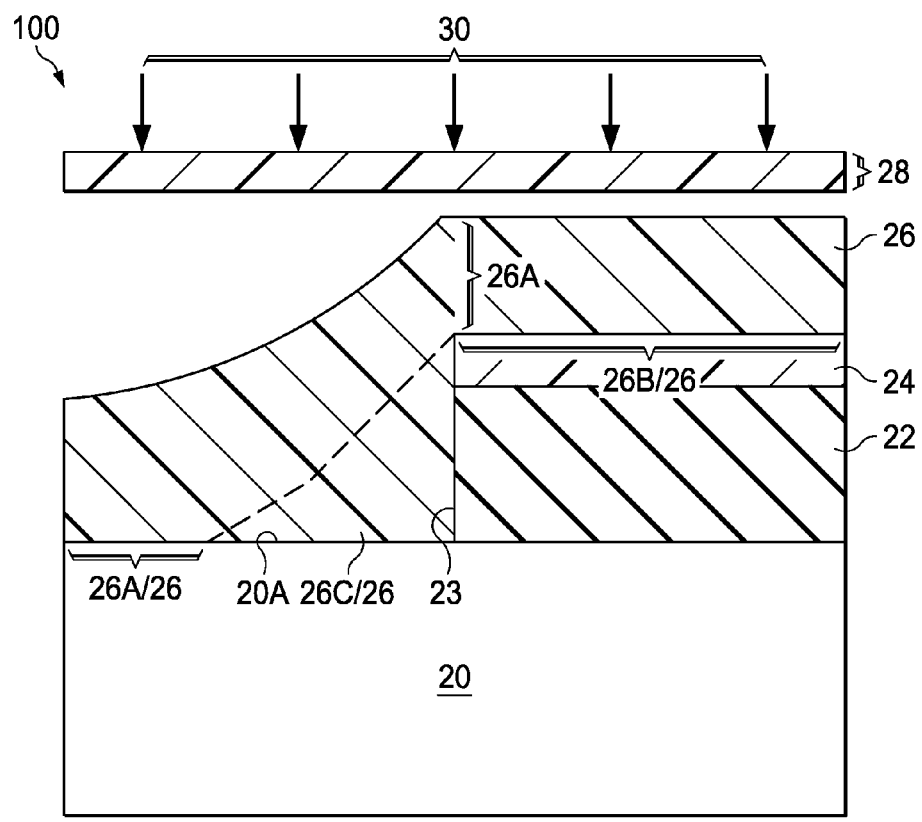

Referring to FIG. 2, an un-patterned exposure is performed on photo resist 26, wherein photo resist 26 is exposed to light 30 uniformly. Throughout the description, the term "un-patterned exposure" refers to the exposure of a photo resist without using patterned lithography mask that includes opaque patterns for blocking light and transparent portions for allowing light to pass through. In some embodiments, no mask is placed over photo resist 26 when the un-patterned exposure is performed. In alternative embodiments, mask 28 may be placed over photo resist 26 and in the light path of light 30. Mask 28, however, is not patterned, which means that the light intensity of light 30 is reduced uniformly (but not fully blocked) by mask 28.

Referring to FIG. 2, in the embodiments in which photo resist 26 is a positive tone photo resist, an over exposure is performed using a high light energy. In accordance with embodiments of the present disclosure, when photo resist 26 is a positive tone photo resist, the light energy for the exposure is adjusted and increased to a level that partial cross-links are generated in regions 26C, and regions 26A and 26B are not cross-linked This is different from conventional photo lithography processes, in which partial cross-links are not to be generated, regardless of whether a positive or a negative tone photo resist is used. Positive tone photo resists may have a characteristic that when it is over-exposed to a certain degree, partial cross-linking may occur in some over-exposed portions. As a result, the partial cross-linked portions of the photo resist are not removed in the subsequent development of the photo resist. The remaining exposed portions of the positive tone photo resist (which do not have partial cross-links) are decomposed. Throughout the description, when a positive tone photo resist region is referred to as partially cross-linked, it means that the number of the cross-links generated therein is high enough to cause the respective photo resist region to remain after the subsequent development steps.

In some embodiments, the partial cross-linked photo resist 26 is a positive tone photo resist, and is not an ideal positive tone photo resist. The partial cross-linked positive tone photo resist 26 comprises a polymer, and a weak cross-linking agent. When exposed to light, the unexposed portions of partial cross-linked positive tone photo resist 26 behave like a general positive tone photo resist. The unexposed portions of partial cross-linked positive tone photo resist 26 are not decomposed, and will not be removed by the development step. The exposed portions of partial cross-linked positive tone photo resist 26 behave like a general positive tone photo resist when exposed to light and the energy of light is not high enough to generate cross-linking reactions. The exposed portions of partial cross-linked positive tone photo resist 26 are decomposed, and will be removed by the development step. When exposed to light and the energy of light is high enough to generate the cross-linking reactions, the exposed portions of partial cross-linked positive tone photo resist 26 are slightly cross-linked, and will be partially removed by the development step. The remaining thickness of the exposed portions of partial cross-linked positive tone photo resist 26 is related to the completion level of the cross-linking reactions, which completion level of the cross-linking reactions is further related to, but not limited to, the energy of the exposed light, energy distribution of the exposed light, the reflection light from substrate, the refraction light and scattering light from neighborhood environments, and the post-exposure bake temperature.

The needed light energy for exposing photo resist 26 depends on the type and the composition of the photo resist. For example, an exemplary partial cross-linked positive tone photo resist 26 is under a normal exposure (without generating partial cross-links) when exposed to the light with an energy of about 10 milli-Joule/cm$^2$. When the energy of the light is increased to about 30 milli-Joule/cm2, partial cross-linking reactions occur in the exposed portions, and the remaining thickness of the exposed portions of partial cross-linked positive tone resist 26 may only be about 10% of the original thickness. When the energy of light is further increased to about 70 milli-Joule/cm$^2$, the remaining thickness of the exposed portions of partial cross-linked positive tone resist 26 may be increased to about 70% of the original thickness.

In alternative embodiments, the partial cross-linked photo resist 26 is a negative tone photo resist, and is not an ideal negative tone photo resist. The partial cross-linked negative tone photo resist 26 comprises a polymer, and a weak cross-linking agent. When exposed to light, the unexposed portions of partial cross-linked negative tone photo resist 26 behave like a general negative tone photo resist. The unexposed portions of partial cross-linked negative tone photo resist 26 will be removed by the development step. The exposed portions of partial cross-linked negative tone photo resist 26 behave like a general negative tone photo resist when exposed to light and the energy of light is high enough to generate and complete the cross-linking reactions. The exposed portions of partial cross-linked negative tone photo resist 26 will not be removed by the development step. When exposed to light and the energy of light is not high enough, the exposed portions of partial cross-linked negative tone photo resist 26 are slightly cross-linked, and will be partially removed by the development step. The remaining thickness of the exposed portions of partial cross-linked negative tone photo resist 26 is also related to the completion level of the cross-linking reactions, which completion level is related to, but not limited to, the energy of the exposed light, energy distribution of the exposed light, the reflection light from substrate, the refraction light and scattering light from neighborhood environments, and the post-exposure bake temperature.

In some exemplary embodiments, an exemplary partial cross-linked negative tone photo resist 26 is under a normal exposure (with the all exposed portions are remaining after development) when exposed to the light with energy of about 100 milli-Joule/cm$^2$. When the energy of light is decreased to about 60 milli-Joule/cm$^2$, partial cross-linking reactions occur in the exposed portions, and the remaining thickness of the exposed portions of partial cross-linked negative tone resist 26 may be about 50% of the original thickness. When the energy of light is further decreased to about 20 milli-Joule/cm$^2$, the remaining thickness of the exposed portions of partial cross-linked negative tone resist 26 is decreased to about 10% of the original thickness.

The locations and the sizes in which the partial cross-links will be generated are related to the topology of the photo resist, even if they are exposed to the same light exposure energy. For example, as shown in FIG. 2, corner photo resist region 26C is a region that partial cross-links are likely to occur. Corner photo resist region 26C is at the corner formed between top surface 20A of base structure 20 and sidewall 23 of features 22 and 24. Photo resist region 26A and 26B, which are over flat surfaces or surface portions of photo resist 26, are less likely to have partial cross-links generated, and are decomposed due to the light exposure. Alternatively stated, the positive tone photo resist regions over flat surfaces need a relatively great amount of light exposure (energy) before the partial cross-links can be generated, and the positive tone photo resist regions over high-topology surfaces need a relatively small amount of light exposure (energy) before the partial cross-links are generated. For example, assuming the light energy (measured as milli-Joules/cm$^2$, for example) used for exposing photo resist 26 in a normal exposure step is En, then exposure energy 2En is needed to cause partial cross-links to be generated in photo resist region 26C, while exposure energy 5En is needed to cause partial cross-links to be generated in photo resist regions 26A and/or 26B. In some exemplary embodiments, a reference light energy is selected to be the light energy used for exposing photo resist 36 (FIG. 5, when it is a positive tone photo resist). Accordingly, the energy for exposing photo resist 26 may be two times to five times the energy used for exposing photo resist 36.

The needed light energy for exposing photo resist 26 depends on the type and the composition of the photo resist. In some embodiments, the energy for exposing positive tone photo resist 26 in a normal exposure (without generating partial cross-links) may be between about 10 milli-Joule/cm$^2$ and about 30 milli-Joule/cm$^2$. In accordance with some embodiments, to over expose positive tone photo resist 26 to cause partial cross-links to be generated, the light energy may be between about 20 milli-Joule/cm$^2$ and about 150 milli-Joule/cm$^2$, depending on the type of photo resist and the topology of the patterned surface.

In alternative embodiments in which photo resist 26 is a negative tone photo resist, an under-exposure is performed using a low light energy. When the negative tone photo resist 26 is under exposed, partial cross-links may be generated in some portions of photo resist 26. The partially cross-linked portions are not removed in the subsequent development step. Other portions of photo resist 26 do not have enough cross-links generated to cause it to be partially cross-linked, and can be removed in subsequent steps. Similarly, the locations in which the partial cross-links are generated are related to the topology of wafer 100. For example, corner photo resist region 26C is more likely to have partial cross-links generated than photo resist regions 26A and 26B. In accordance with some embodiments of the present disclosure, the light energy is adjusted and reduced to a level that partial cross-links are generated in regions 26C, and regions 26A and 26B are not cross-linked.

In some embodiments, the normal energy En for exposing a negative tone photo resist 26 in a normal exposure (without generating partial cross-links) may be between about 100 milli-Joule/cm$^2$ and about 300 milli-Joule/cm$^2$. It is realized, however, that the energy is also related to the tool used. When the normal exposure occurs, the portions of the negative tone photo resist exposed to light have polymer chains with each other, and the portions of the negative tone photo resist not exposed to light do not have polymer chains cross-link with each other. In accordance with some embodiments, to under-expose negative tone photo resist 26 to cause partial cross-links, the exposure energy may be less than about 1 percent the normal energy En. In some embodiments in which photo resist 36 (FIG. 5) is a negative tone photo resist, a reference energy En is selected to be the energy used for exposing photo resist 36. Accordingly, in some embodiments, the energy for exposing photo resist 26 may be less than about 1 percent the energy for exposing photo resist 36.

Figure 3A:
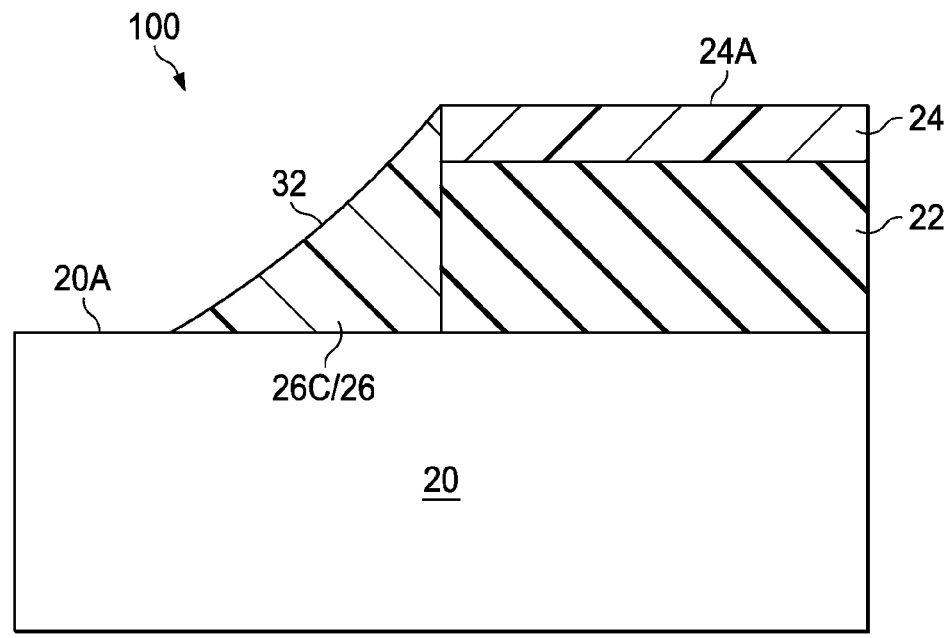

As a result of the partial cross-links, in the subsequent developing steps, photo resist regions 26C remains, while the rest of photo resist 26 are removed. The resulting structure is shown in FIG. 3A. Hence, photo resist region 26C fills the corner region, and form slope 32. The formation of slope 32 reduces the abruptness in the transition between top surface 24A and top surface 20A.

Figure 3B:
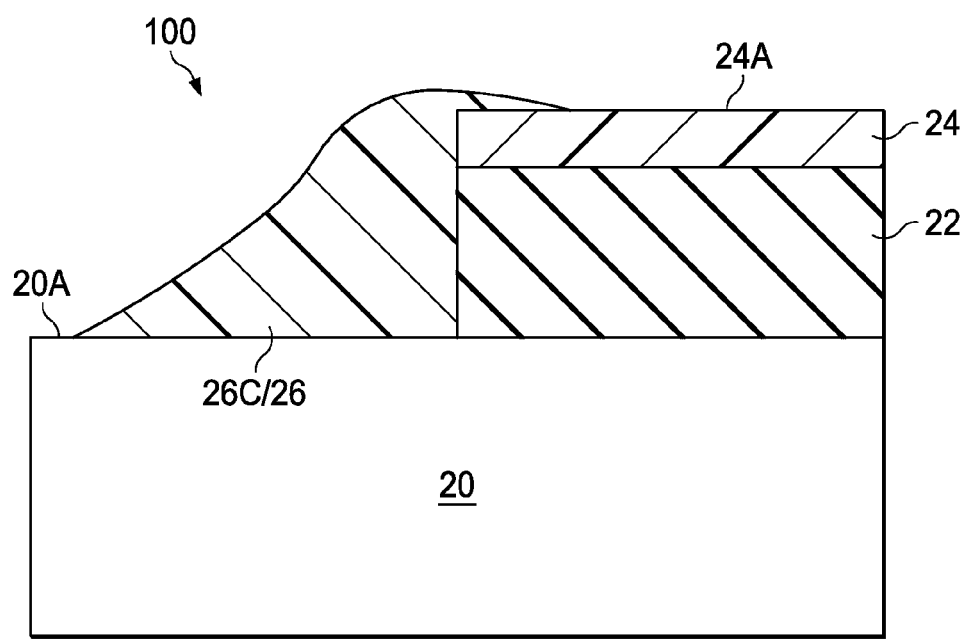
Figure 3C:
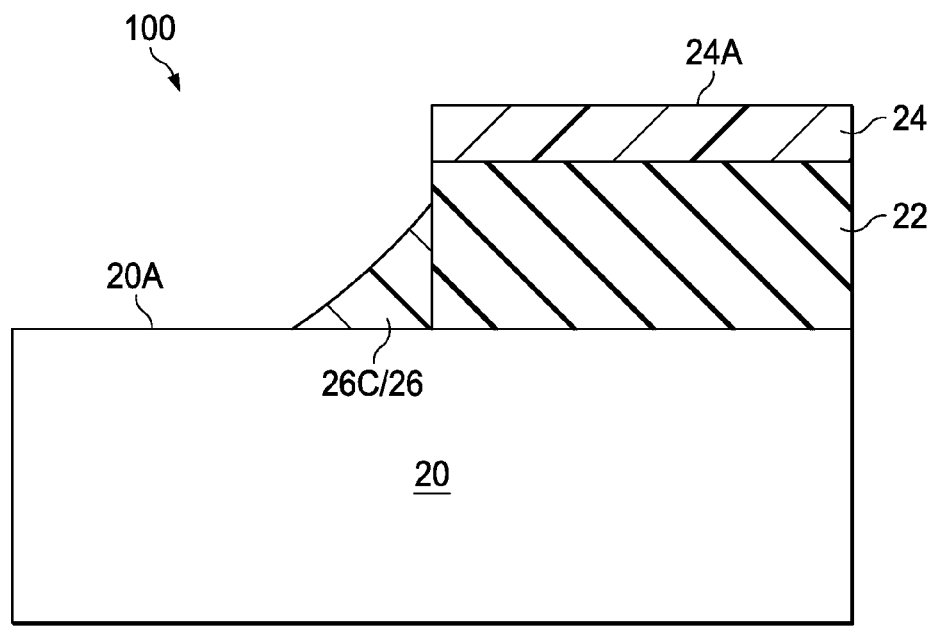

The profile of the remaining photo resist region 26C is related to the energy, For example, for a positive tone photo resist, if a certain exposure energy causes photo resist region 26C to have the profile in FIG. 3A, then increasing the exposure energy for a positive tone photo resist and reducing the exposure energy for a negative tone photo resist may result in the profile shown in FIG. 3B, wherein FIG. 3B has more photo resist left than in FIG. 3A. Conversely, reducing the exposure energy for a positive tone photo resist and increasing the exposure energy for a negative tone photo resist may result in the profile shown in FIG. 3C, wherein FIG. 3C has less photo resist left than in FIG. 3A. Accordingly, an optimum profile of photo resist region 26C (shown in FIG. 3A) may be achieved by experimenting different levels of light energy.

Furthermore, the generation of partial cross-links in photo resist 26 may be achieved by adding cross-linking agent(s) into positive tone photo resists or reducing the cross-linking agent(s) in negative tone photo resists. In some exemplary embodiments, the exemplary cross-linking agent(s) include amino compounds such as melamine resins, urea resins, guanamine resins, glycoluril-formaldehyde resins, succinamide-formaldehyde resins, ethylene urea-formaldehyde resins, and combinations thereof. In addition, by adding cross-linking agent(s) into positive tone photo resists, the required minimum light energy for the desirable over-exposure may be reduced, and by reducing cross-linking agent(s) from negative tone photo resists, the maximum light energy for the desirable under-exposure may be increased. Hence, the over exposure or under exposure is easier, and may be achieved using existing process tools.

Figure 4:
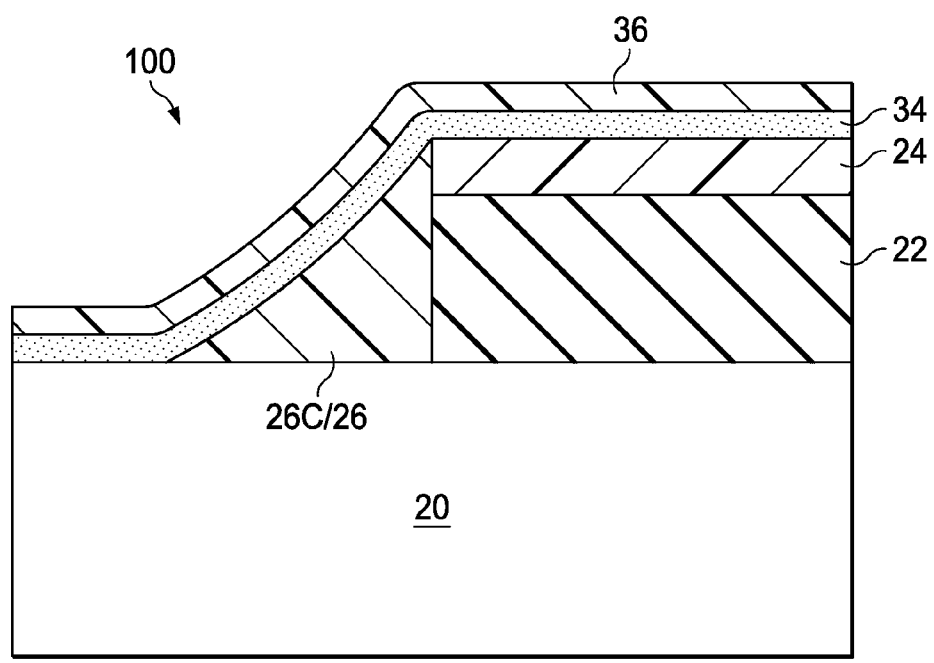

Referring to FIG. 4, Bottom Anti-Reflective Coating (BARC) 34 and photo resist 36 are formed over the structure shown in FIG. 3A. BARC 34 is used to reduce the reflection from the underlying layers. In accordance with some embodiments, BARC 34 comprises an organic material. In alternative embodiments, BARC 34 comprises an inorganic material such as silicon oxynitride. Due to the formation of photo resist region 26C, the thickness uniformity of BARC 34 is improved compared to if photo resist region 26C is not formed.

Photo resist 36 is then coated over BARC 34. In some embodiments, photo resist 36 is a positive tone photo resist. In alternative embodiments, photo resist 36 is a negative tone photo resist. Photo resist 36, regardless of being a positive tone photo resist or a negative tone photo resist, may be selected from the same group of photo resists for forming photo resist 26. Furthermore, photo resist 36 may be the same as, or different from, photo resist 26. Furthermore, photo resists 26 and 36 may be both positive tone photo resists, both negative tone photo resists, or include on positive and one negative tone photo resist. The thickness uniformity of photo resist 36 is also improved compared to if photo resist region 26C is not formed.

Figure 5:
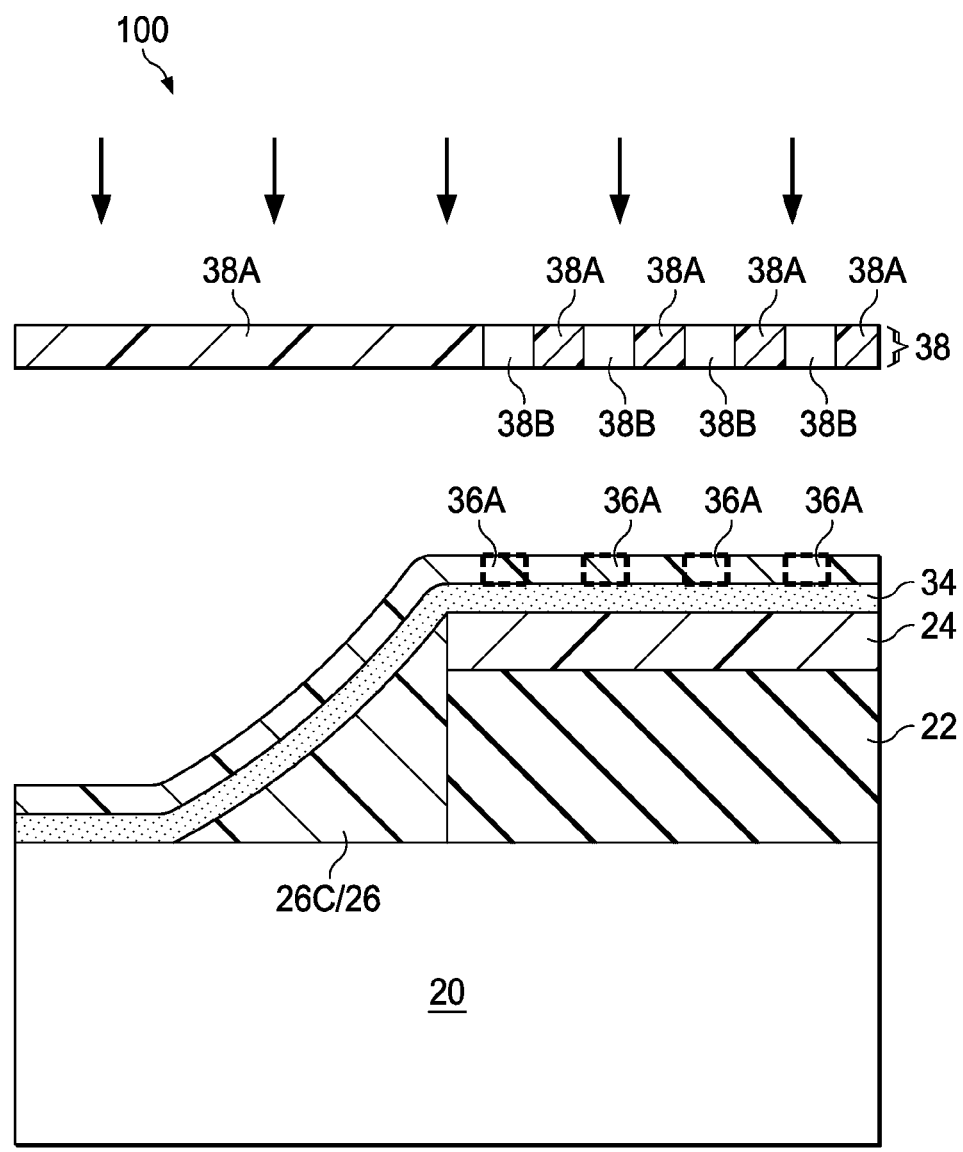

FIG. 5 illustrates the exposure of photo resist 36 using lithography mask 38, which comprises opaque portions 38A and transparent portions 38B. In the illustrated embodiments, photo resist 36 is a positive tone photo resist. The exposed portions 36A of photo resist 36, which are aligned to transparent mask portions 38B, are decomposed. In alternative embodiments (not shown), photo resist 36 may be a negative tone photo resist, and lithography mask 38 may have a pattern opposite to what is shown in FIG. 5.

Figure 6:
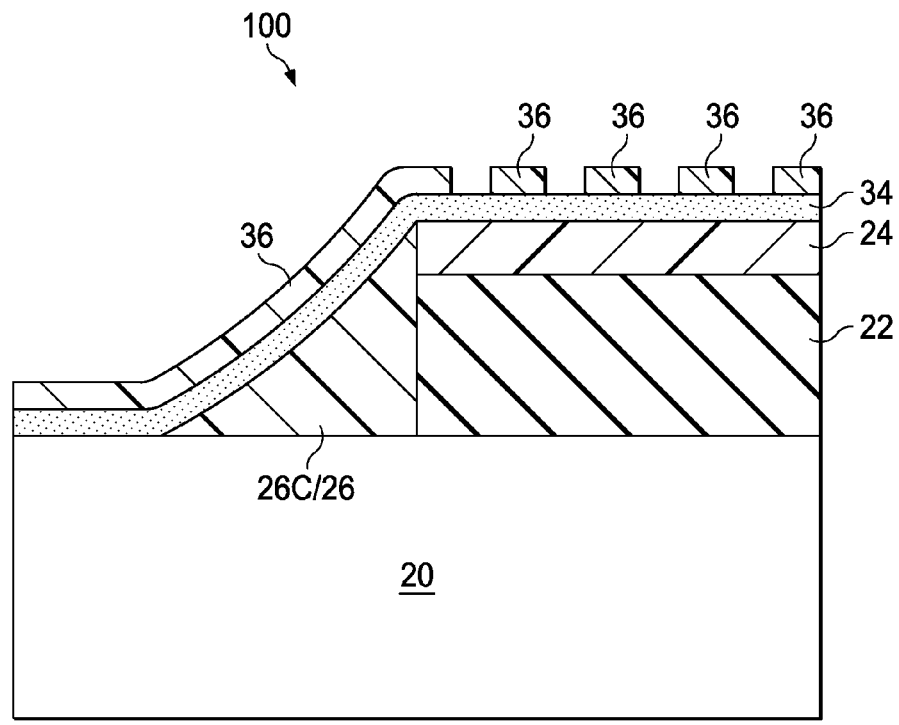
Figure 7:
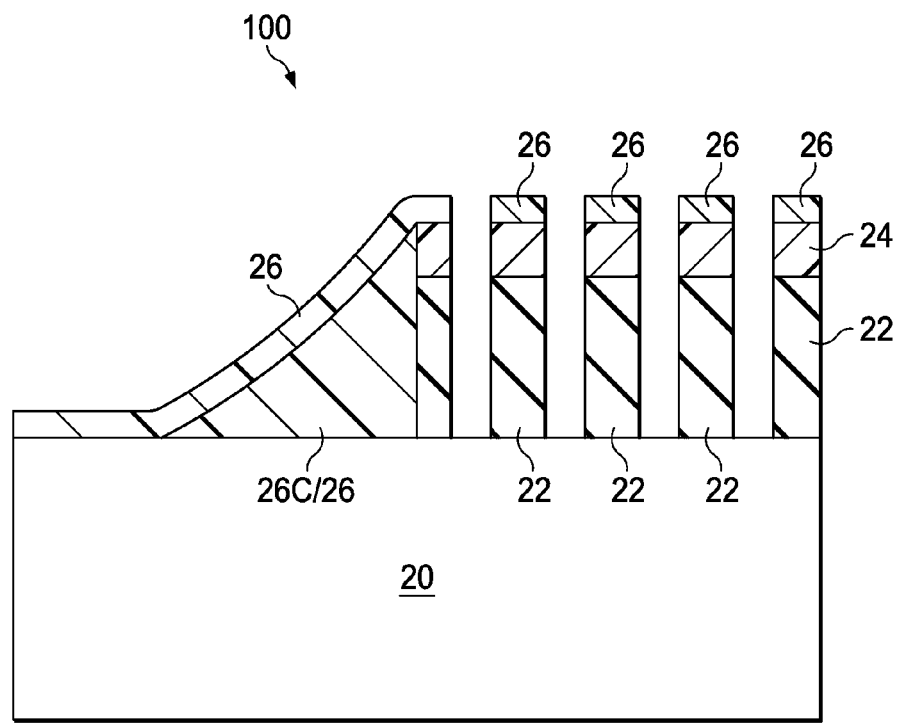
Figure 8:
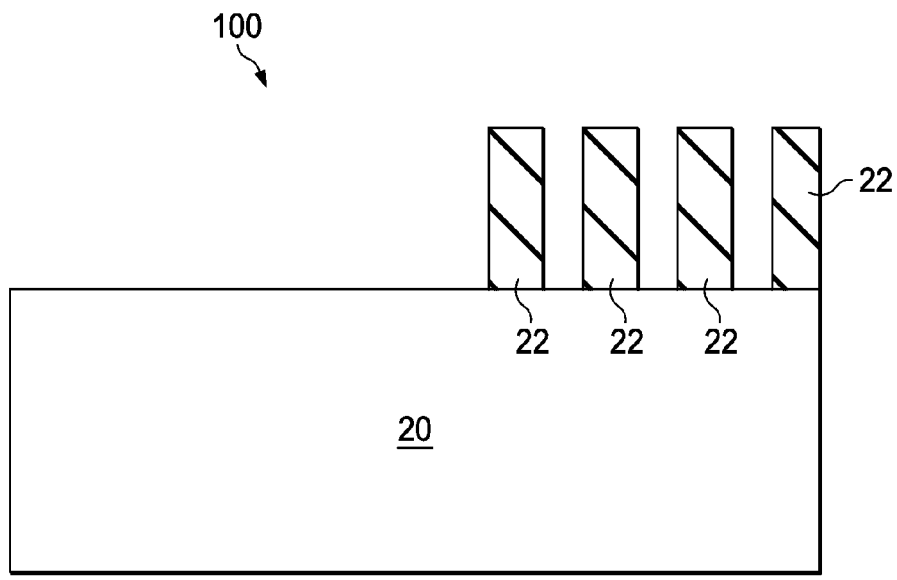

Next, as shown in FIG. 6, photo resist 36 is developed, and photo resist portions 36A (FIG. 5) are removed. The patterned photo resist 36 is then used as an etching mask to etch the underlying hard mask 24 and target feature 22, as shown in FIG. 7. Patterned photo resist 36 may be consumed, and hence are not shown in FIG. 7, although it may have portions remaining after layers 22 and 24 are patterned. After the patterning of target feature 22, photo resist 36, BARC 34, and hard mask 24 are removed, and the resulting structure is shown in FIG. 8.

Figure 9:
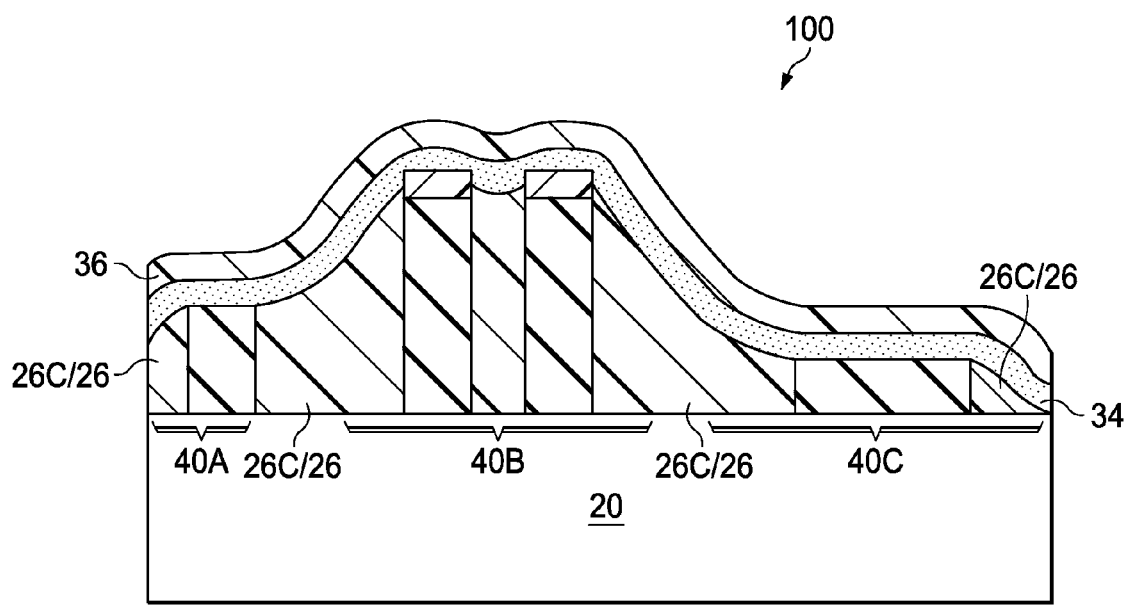
FIG. 9 illustrates a cross-sectional view of a wafer including a plurality of features having different heights in accordance with some alternative exemplary embodiments, wherein the formation of a self-aligned photo resist results in the smoothing of the top surface of the respective wafer.

In the embodiments of the present disclosure, by forming an additional photo resist to smooth the topology of wafers, the BARC layer and the photo resist for defining the patterns of the target layers have improved thickness uniformity. For example, as shown in FIG. 9, wafer 100 may have a plurality of regions 40A, 40B, and 40C that comprise features have different heights therein. Using the embodiments of the present disclosure, photo resist regions 26C are self-aligned to the gaps having different widths and heights, and the topology throughout the entire wafer 100 is smoothened. Since the pattering of the additional photo resist does not require any patterned lithography mask, there is no overlay issue for aligning the lithography mask with the existing patterns on the wafers.

In accordance with some embodiments, a method includes forming a first photo resist layer over a base structure and a target feature over the base structure, performing an un-patterned exposure on the first photo resist layer, and developing the first photo resist layer. After the step of developing, a corner portion of the first photo resist layer remains at a corner between a top surface of the base structure and an edge of the target feature. A second photo resist layer is formed over the target feature, the base structure, and the corner portion of the first photo resist layer. The second photo resist layer is exposed using a patterned lithography mask. The second photo resist layer is patterned to form a patterned photo resist.

In accordance with other embodiments, a method includes forming a first photo resist layer over a base structure and a target feature over the base structure, and performing a first exposure on the first photo resist layer. A corner portion of the first photo resist layer is partially cross-linked after the first exposure, which corner portion is at a corner between a top surface of the base structure and an edge of the target feature. The first photo resist layer is developed. After the step of developing, the corner portion of the first photo resist layer remains, and the first photo resist layer is removed from the region overlapping the target feature. A second photo resist layer is formed over the corner portion of the first photo resist layer, the target feature, and the base structure. A second exposure is performed on the second photo resist layer using a patterned lithography mask. The second photo resist layer is developed to form a patterned photo resist.

In accordance with yet other embodiments, a method includes forming a first positive tone photo resist layer over a base structure and a target feature over the base structure, performing a first exposure on the first positive tone photo resist layer, and developing the first positive tone photo resist layer. After the step of developing, a corner portion of the first positive tone photo resist layer remains at a corner between a top surface of the base structure and an edge of the target feature. A second positive tone photo resist layer is formed over the corner portion of the first positive tone photo resist layer, the target feature, and the base structure. A second exposure is exposed on the second positive tone photo resist layer using a patterned lithography mask. The second positive tone photo resist layer is developed to form a patterned photo resist. The target feature is etched using the patterned photo resist as an etching mask.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first photo resist layer over a base structure and a target feature, with the target feature over and contacting a planar top surface of the base structure, wherein the first photo resist layer comprises a first portion over and contacting the base structure, a second portion over and contacting the target feature, and a corner portion at a corner formed between the planar top surface of the base structure and a sidewall of the target feature;
   performing an un-patterned exposure on the first photo resist layer such that cross-linking is generated in the corner portion;
   developing the first photo resist layer, wherein after the step of developing, the first portion and the second portion of the first photo resist layer are removed and the corner portion remains;
   forming a second photo resist layer over the target feature, the base structure, and the corner portion of the first photo resist layer;
   exposing the second photo resist layer using a patterned lithography mask; and
   developing the second photo resist layer to form a patterned photo resist.

2. The method of claim 1 further comprising:
   etching the target feature using the patterned photo resist as an etching mask;
   removing the patterned photo resist; and
   removing the corner portion of the first photo resist layer.

3. The method of claim 1, wherein the first photo resist layer comprises a positive tone photo resist.

4. The method of claim 3, wherein the un-patterned exposure comprises an over exposure, and wherein partial cross-links are generated in the corner portion of the first photo resist layer.

5. The method of claim 1, wherein the first photo resist layer comprises a negative tone photo resist.

6. The method of claim 5, wherein the un-patterned exposure comprises an under exposure, and wherein partial cross-links are generated in the corner portion of the first photo resist layer.

7. The method of claim 1 further comprising, after the step of developing the first photo resist layer and before the step of forming the second photo resist layer, forming a Bottom Anti-Reflective Coating (BARC) over the target feature and the corner portion of the first photo resist layer.

8. A method comprising:
forming a target feature protruding above a base structure;
forming a first photo resist layer over both the base structure and the target feature, wherein the first photo resist layer comprises:
  a corner portion having a sidewall contacting a sidewall of the target feature, and a bottom surface contacting a top surface of the base structure; and
  additional portions over and contacting the target feature and the base structure;
performing a first exposure on the first photo resist layer, wherein the corner portion of the first photo resist layer is partially cross-linked after the first exposure;
developing the first photo resist layer, wherein after the step of developing, the corner portion of the first photo resist layer remains, and the additional portions of the first photo resist layer are removed;
forming a second photo resist layer over the corner portion of the first photo resist layer, the target feature, and the base structure;
performing a second exposure on the second photo resist layer using a patterned lithography mask; and
developing the second photo resist layer to form a patterned photo resist.

9. The method of claim 8 further comprising:
etching the target feature using the patterned photo resist as an etching mask;
removing the patterned photo resist; and
removing the corner portion of the first photo resist layer.

10. The method of claim 8, wherein the first photo resist layer comprises a positive tone photo resist, and wherein the first exposure comprises an over exposure.

11. The method of claim 8, wherein the first photo resist layer comprises a negative tone photo resist, and wherein the first exposure comprises an under exposure.

12. The method of claim 8 further comprising, after the step of developing the first photo resist layer and before the step of forming the second photo resist layer, forming a Bottom Anti-Reflective Coating (BARC) over the corner portion of the first photo resist layer and the target feature.

13. The method of claim 8, wherein in the first exposure, no lithography mask is used.

14. A method comprising:
forming a first positive tone photo resist layer over a base structure and a target feature, with the target feature protruding over the base structure, wherein the first positive tone photo resist layer comprises a first portion over and contacting the base structure, a second portion over and contacting the target feature, and a corner portion at a corner formed between a top surface of the base structure and an edge of the target feature;
performing a first exposure on the first positive tone photo resist layer, wherein the first exposure is an over exposure, and the first exposure results in partial cross-linking to be generated in the corner portion, and no cross-linking generated in additional portions of the first positive tone photo resist that are directly over the base structure and the target feature;
developing the first positive tone photo resist layer, wherein after the step of developing, the corner portion of the first positive tone photo resist layer remains, and the additional portions of the first positive tone photo resist layer are removed;
forming a second positive tone photo resist layer over the corner portion of the first positive tone photo resist layer, the target feature, and the base structure;
performing a second exposure on the second positive tone photo resist layer using a patterned lithography mask;
developing the second positive tone photo resist layer to form a patterned photo resist; and
etching the target feature using the patterned photo resist as an etching mask.

15. The method of claim 14, wherein the first exposure is a non-patterned exposure without using any patterned lithography mask.

16. The method of claim 14, wherein the first exposure is performed using a first energy, and the second exposure is performed using a second energy, and wherein the first energy is greater than about two times the second energy.

17. The method of claim 16, wherein the first energy is greater than about five times the second energy.

18. The method of claim 14, wherein after the first exposure, partial cross-links are generated in the corner portion of the first positive tone photo resist layer.

19. The method of claim 14 further comprising, after the step of developing the first positive tone photo resist layer and before the step of forming the second positive tone photo resist layer, forming a Bottom Anti-Reflective Coating (BARC) over the corner portion of the first positive tone photo resist layer and the target feature.

20. The method of claim 14 further comprising, after etching the target feature, removing the first and the second positive tone photo resist layers.

\* \* \* \* \*